United States Patent
Li

(10) Patent No.: US 10,789,011 B2
(45) Date of Patent: Sep. 29, 2020

(54) PERFORMANCE ENHANCEMENT OF A STORAGE DEVICE USING AN INTEGRATED CONTROLLER-BUFFER

(71) Applicant: Alibaba Group Holding Limited, George Town, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 0 days.

(21) Appl. No.: 15/717,100

(22) Filed: Sep. 27, 2017

(65) Prior Publication Data

US 2019/0095134 A1 Mar. 28, 2019

(51) Int. Cl.
*G06F 3/06* (2006.01)
*G06F 11/10* (2006.01)
*G11C 29/52* (2006.01)

(52) U.S. Cl.
CPC .......... *G06F 3/0659* (2013.01); *G06F 3/061* (2013.01); *G06F 3/0604* (2013.01); *G06F 3/0656* (2013.01); *G06F 3/0679* (2013.01); *G06F 11/1004* (2013.01); *G06F 11/1012* (2013.01); *G06F 11/1068* (2013.01); *G11C 29/52* (2013.01)

(58) Field of Classification Search
CPC .................... G06F 12/0246; G06F 12/0866
See application file for complete search history.

(56) References Cited

U.S. PATENT DOCUMENTS 4,775,932 A * 10/1988 Oxley ............... G06F 12/0253
6,226,650 B1 5/2001 Mahajan et al.
7,565,454 B2 7/2009 Zuberi
8,260,924 B2 9/2012 Koretz
8,452,819 B1 5/2013 Sorenson, III
8,516,284 B2 8/2013 Chan
8,751,763 B1 6/2014 Ramarao
8,825,937 B2 9/2014 Atkisson
(Continued)

FOREIGN PATENT DOCUMENTS

WO 1994018634 8/1994

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

(Continued)

*Primary Examiner* — Edward J Dudek, Jr.
(74) *Attorney, Agent, or Firm* — Shun Yao; Park, Vaughan, Fleming & Dowler LLP

(57) ABSTRACT

Embodiments described herein provide a system for facilitating performance enhancement of a storage device. During operation, the system obtains a write request for storing a data page in the storage device. The system then stores the page in a non-volatile accumulation buffer integrated with the storage device and determines whether the accumulation buffer has accumulated at least one block of data. The block of data can indicate a unit of an erasure operation on the storage device. If the accumulation buffer has accumulated the one block of data, the system transfers the block of data to a first block in the storage device from the accumulation buffer.

20 Claims, 14 Drawing Sheets

(56) References Cited

U.S. PATENT DOCUMENTS

| | | | |
|---|---|---|---|
| 9,043,545 B2 | 5/2015 | Kimmel | |
| 9,088,300 B1 | 7/2015 | Chen | |
| 9,092,223 B1 | 7/2015 | Pani | |
| 9,280,472 B1 | 3/2016 | Dang | |
| 9,280,487 B2 | 3/2016 | Candelaria | |
| 9,529,601 B1 | 12/2016 | Dharmadhikari | |
| 9,588,698 B1 | 3/2017 | Karamcheti | |
| 9,588,977 B1 | 3/2017 | Wang | |
| 10,013,169 B2 | 7/2018 | Fisher | |
| 2002/0010783 A1 | 1/2002 | Primak | |
| 2002/0073358 A1 | 6/2002 | Atkinson | |
| 2002/0161890 A1 | 10/2002 | Chen | |
| 2003/0163594 A1 | 8/2003 | Aasheim | |
| 2003/0163633 A1 | 8/2003 | Aasheim | |
| 2004/0010545 A1 | 1/2004 | Pandya | |
| 2004/0255171 A1 | 12/2004 | Zimmer | |
| 2004/0268278 A1 | 12/2004 | Hoberman | |
| 2005/0038954 A1 | 2/2005 | Saliba | |
| 2005/0097126 A1 | 5/2005 | Cabrera | |
| 2005/0177755 A1 | 8/2005 | Fung | |
| 2005/0195635 A1 | 9/2005 | Conley | |
| 2005/0235067 A1 | 10/2005 | Creta | |
| 2005/0235171 A1 | 10/2005 | Igari | |
| 2006/0156012 A1 | 7/2006 | Beeson | |
| 2007/0033323 A1* | 2/2007 | Gorobets | G06F 3/0607 |
| | | | 711/103 |
| 2007/0101096 A1 | 5/2007 | Gorobets | |
| 2008/0034154 A1 | 2/2008 | Lee | |
| 2009/0113219 A1 | 4/2009 | Aharonov | |
| 2009/0282275 A1 | 11/2009 | Yermalayeu | |
| 2009/0307249 A1 | 12/2009 | Koifman | |
| 2009/0310412 A1 | 12/2009 | Jang | |
| 2010/0169470 A1 | 7/2010 | Takashige | |
| 2010/0229224 A1 | 9/2010 | Etchegoyen | |
| 2010/0325367 A1 | 12/2010 | Kornegay | |
| 2011/0055458 A1* | 3/2011 | Kuehne | G06F 12/0246 |
| | | | 711/103 |
| 2011/0153903 A1 | 6/2011 | Hinkle | |
| 2011/0218969 A1 | 9/2011 | Anglin | |
| 2011/0231598 A1* | 9/2011 | Hatsuda | G06F 12/0804 |
| | | | 711/103 |
| 2011/0292538 A1 | 12/2011 | Haga | |
| 2011/0302353 A1* | 12/2011 | Confalonieri | G11C 13/0004 |
| | | | 711/103 |
| 2012/0084523 A1 | 4/2012 | Littlefield | |
| 2012/0117399 A1 | 5/2012 | Chan | |
| 2012/0147021 A1 | 6/2012 | Cheng | |
| 2012/0159289 A1 | 6/2012 | Piccirillo | |
| 2012/0210095 A1 | 8/2012 | Nellans | |
| 2012/0246392 A1* | 9/2012 | Cheon | G06F 12/0871 |
| | | | 711/103 |
| 2012/0278579 A1 | 11/2012 | Goss | |
| 2012/0284587 A1 | 11/2012 | Yu | |
| 2013/0061029 A1 | 3/2013 | Huff | |
| 2013/0073798 A1 | 3/2013 | Kang | |
| 2013/0145085 A1 | 6/2013 | Yu | |
| 2013/0145089 A1 | 6/2013 | Eleftheriou | |
| 2013/0151759 A1 | 6/2013 | Shim | |
| 2013/0159251 A1 | 6/2013 | Skrenta | |
| 2013/0166820 A1 | 6/2013 | Batwara | |
| 2013/0173845 A1 | 7/2013 | Aslam | |
| 2013/0219131 A1 | 8/2013 | Alexandron | |
| 2013/0318283 A1* | 11/2013 | Small | G06F 12/0246 |
| | | | 711/103 |
| 2014/0108414 A1 | 4/2014 | Stillerman | |
| 2014/0181532 A1 | 6/2014 | Camp | |
| 2014/0233950 A1 | 8/2014 | Luo | |
| 2014/0250259 A1* | 9/2014 | Ke | G06F 12/0246 |
| | | | 711/103 |
| 2014/0304452 A1 | 10/2014 | De La Iglesia | |
| 2014/0310574 A1 | 10/2014 | Yu | |
| 2014/0359229 A1 | 12/2014 | Cota-Robles | |
| 2014/0365707 A1 | 12/2014 | Talagala | |
| 2015/0019798 A1 | 1/2015 | Huang | |
| 2015/0082317 A1 | 3/2015 | You | |
| 2015/0106556 A1 | 4/2015 | Yu | |
| 2015/0106559 A1 | 4/2015 | Cho | |
| 2015/0142752 A1 | 5/2015 | Chennamsetty | |
| 2015/0227316 A1 | 8/2015 | Warfield | |
| 2015/0277937 A1 | 10/2015 | Swanson | |
| 2015/0304108 A1 | 10/2015 | Obukhov | |
| 2015/0309924 A1* | 10/2015 | Chen | G06F 13/385 |
| | | | 711/103 |
| 2015/0363271 A1 | 12/2015 | Haustein | |
| 2015/0372597 A1 | 12/2015 | Luo | |
| 2016/0014039 A1 | 1/2016 | Reddy | |
| 2016/0098344 A1 | 4/2016 | Gorobets | |
| 2016/0110254 A1 | 4/2016 | Cronie | |
| 2016/0232103 A1 | 8/2016 | Schmisseur | |
| 2016/0239074 A1 | 8/2016 | Lee | |
| 2016/0239380 A1 | 8/2016 | Wideman | |
| 2016/0274636 A1 | 9/2016 | Kim | |
| 2016/0306853 A1 | 10/2016 | Sabaa | |
| 2016/0343429 A1 | 11/2016 | Nieuwejaar | |
| 2016/0350002 A1 | 12/2016 | Vergis | |
| 2017/0075583 A1 | 3/2017 | Alexander | |
| 2017/0075594 A1 | 3/2017 | Badam | |
| 2017/0109232 A1 | 4/2017 | Cha | |
| 2017/0162235 A1 | 6/2017 | De | |
| 2017/0168986 A1 | 6/2017 | Sajeepa | |
| 2017/0212708 A1 | 7/2017 | Suhas | |
| 2017/0228157 A1 | 8/2017 | Yang | |
| 2017/0249162 A1 | 8/2017 | Tsirkin | |
| 2017/0262178 A1 | 9/2017 | Hashimoto | |
| 2017/0285976 A1 | 10/2017 | Durham | |
| 2017/0286311 A1 | 10/2017 | Juenemann | |
| 2017/0344470 A1 | 11/2017 | Yang | |
| 2017/0344491 A1 | 11/2017 | Pandurangan | |
| 2017/0353576 A1 | 12/2017 | Guim Bernat | |
| 2018/0024772 A1 | 1/2018 | Madraswala | |
| 2018/0088867 A1* | 3/2018 | Kaminaga | G11C 16/0483 |
| 2018/0143780 A1 | 5/2018 | Cho | |
| 2018/0167268 A1 | 6/2018 | Liguori | |
| 2018/0189182 A1 | 7/2018 | Wang | |
| 2018/0270110 A1 | 9/2018 | Chugtu | |
| 2018/0329776 A1 | 11/2018 | Lai | |
| 2018/0373428 A1 | 12/2018 | Kan | |
| 2019/0012111 A1 | 1/2019 | Li | |
| 2019/0073262 A1 | 3/2019 | Chen | |

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices" < FAST '11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

* cited by examiner

PERFORMANCE ENHANCEMENT OF A STORAGE DEVICE USING AN INTEGRATED CONTROLLER-BUFFER

BACKGROUND

Field

This disclosure is generally related to the field of data storage. More specifically, this disclosure is related to a system and method for facilitating accumulation-buffer-based performance enhancement of a storage device.

Related Art

The proliferation of the Internet and e-commerce continues to create a vast amount of digital content. Distributed storage systems have been created to access and store such digital content. A traditional distributed storage system is designed for handling a varying degree of scenarios. As a result, such storage systems can require fast and reliable storage devices. However, to ensure compatibility with legacy applications, many features of the high-performance storage devices can become a bottleneck for the newer operations supported by the storage devices.

For example, to support legacy read/write operations, a high-performance storage device, such as a solid state drive (SSD), reads and writes data with a unit of a page. However, to accommodate faster data turnover, the storage device can physically erase data with a unit of a block, which can include a plurality of pages. As a result, the storage device may not support in-place overwrite for a page. Therefore, when a page is updated, the storage device rewrites the corresponding data in a new page and marks the original page as invalid. Since other valid pages can exist in the block, this invalid page may not be physically erased immediately and released as a free space for future write. As a result, a large number of blocks can be used in the storage device, and many such blocks can include both valid pages and invalid pages.

As a result, the "garbage collection" process that frees up blocks can become tedious. The garbage collection process is triggered to collect the valid pages from a block and write those valid pages into the free blocks. The garbage collection then marks the moved pages in the old block as invalid. The old blocks with invalid pages are erased to get a free block to supply the free block pool.

While a high-performance storage device brings many desirable features to a storage system, some issues remain unsolved in facilitating efficient block management in the storage device.

SUMMARY

Embodiments described herein provide a system for facilitating performance enhancement of a storage device. During operation, the system obtains a write request for storing a data page in the storage device. The system then stores the page in a non-volatile accumulation buffer integrated with the storage device and determines whether the accumulation buffer has accumulated at least one block of data. The block of data can indicate a unit of an erasure operation on the storage device. If the accumulation buffer has accumulated the one block of data, the system transfers the block of data to a first block in the storage device from the accumulation buffer.

In a variation on this embodiment, the system transfers the block of data. To do so, the system identifies the first block in a free block pool in the storage device, transfers a respective data page in the block of data to a page buffer of a flash die comprising the first block, and programs the flash die to store the data page in the first block.

In a further variation, the accumulation buffer is based on a resistive random-access memory (ReRAM) and the flash die is based on a Not AND (NAND) die.

In a variation on this embodiment, the accumulation buffer includes a plurality of zones. A respective zone corresponds to a flash die via a channel in the storage device and is configured to accumulate a block of data.

In a variation on this embodiment, the system obtains a read request for retrieving the data page and determines whether the data page is in the accumulation buffer. If the data page is in the accumulation buffer, the system transfers the data page from the accumulation buffer to a read buffer integrated with the storage device.

In a further variation, if the data page is not in the accumulation buffer, the system transfers the data page from the first block to the read buffer integrated with the storage device.

In a variation on this embodiment, the system represents the first block as a logical file. The system then maintains a first mapping that maps a filename of the logical file and a corresponding logical index to a first physical index identifying the block of data in the storage device. The system also maintains a second mapping that maps an offset from the logical index to a second physical index identifying a subpage in the block of data in the storage device.

In a variation on this embodiment, the system determines whether data in a second block in the storage device can be safely retained. If the data in the second block cannot be safely retained, the system refreshes the second block by transferring the data in the second block to a third block via the accumulation buffer.

In a variation on this embodiment, the system determines whether data in a second block in the storage device has been updated. If the data in the second block has been updated, the system stores the updated data. To do so, the system transfers the data in the second block to the accumulation buffer, updates the transferred data in the accumulation buffer, and transfers the updated data in the accumulation buffer to a third block in a free block pool of the storage device.

In a variation on this embodiment, the system enables a lock on a flash die that includes a second block comprising expired data in the storage device, thereby blocking read/write operation on the flash die. The system then performs an erasure operation that removes the expired data from the second block, releases the lock on the flash die, and adds the second block to a free block pool of the storage device.

BRIEF DESCRIPTION OF THE FIGURES

In the figures, like reference numerals refer to the same figure elements.

DETAILED DESCRIPTION

Figure 1A:
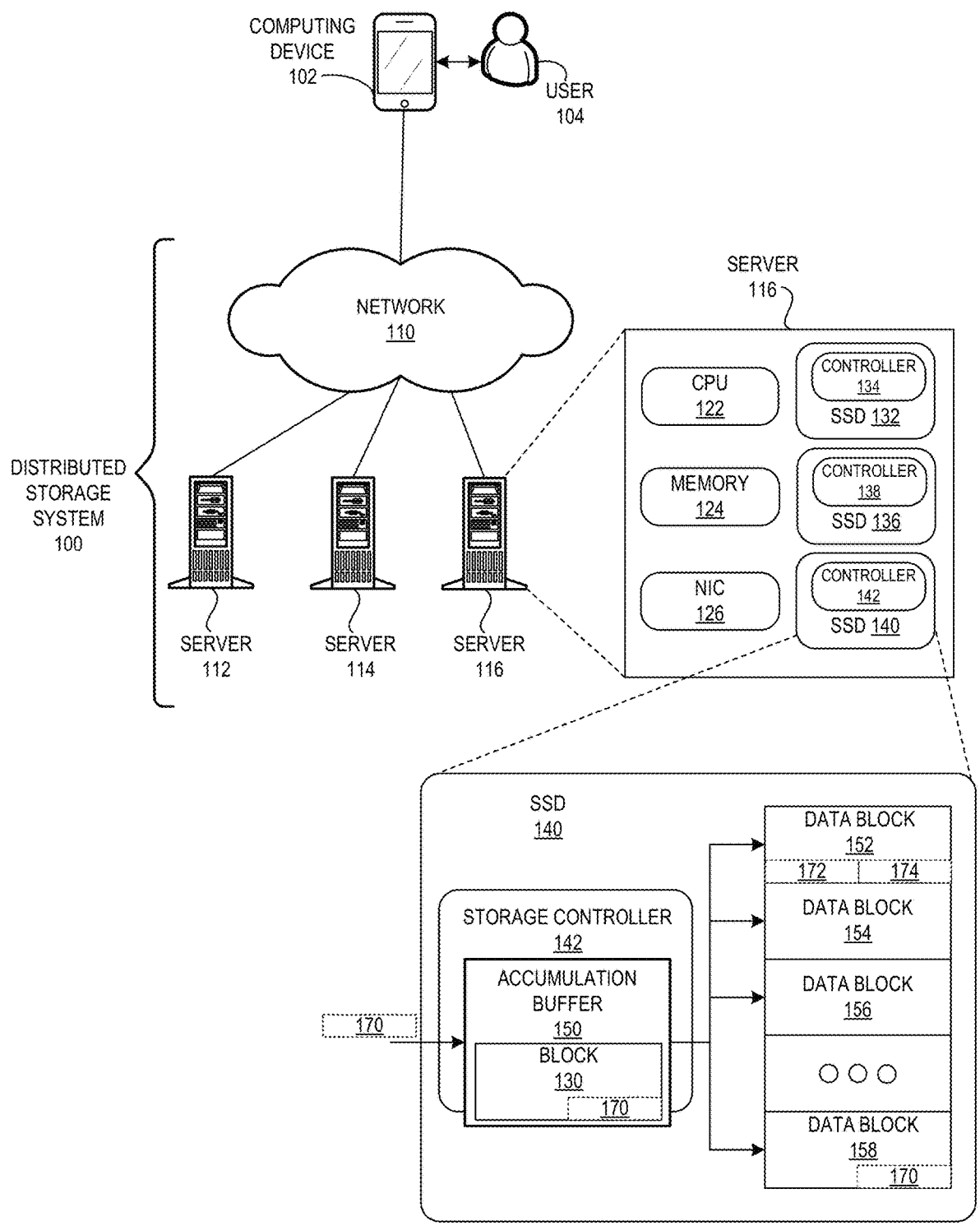
FIG. 1A illustrates an exemplary distributed storage system facilitating enhanced data storage management, in accordance with an embodiment of the present application.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein solve the problem of internal performance bottleneck of a storage device by integrating an accumulation buffer with the storage device. The accumulation buffer can be integrated with the controller of the storage device. When the accumulation buffer collects sufficient pages to fill one block, the controller transfers the block from the accumulation buffer to the storage device, thereby reducing the internal background read and write operations in the storage device.

With existing technologies, high-performance storage devices, such as SSDs, in a distributed storage system are typically constructed using Not AND (NAND) gates. To support legacy applications, a storage device can read and/or write data with the unit of a page (e.g., a 16 kilobyte, or KB, data segment), and physically erases data with the unit of a block (e.g., a 4 megabyte, or MB, data segment). Since NAND-based storage may not support in-place overwrite for a page, if a page is updated in a block, the controller rewrites the updated data in a new page and marks the original page as invalid. Since other valid pages can exist in the block, the block remains operational and continues to store valid data. The invalid page may remain in the block and may not be physically erased and released as a free space for future write.

As a result, a large number of blocks can be used in the storage device, and many such blocks can include both valid pages and invalid pages. To free a block, the controller can trigger a garbage collector, which collects a respective valid page in the block, and write the page to another block. The garbage collector then marks the page in the block as invalid. When all valid pages are moved from the block, the block becomes a free block. The controller then adds the block to the free block pool. This process can lead to background read/write operations in the storage device. The background read/write operations share the total bandwidth and storage management capacity of the storage with the external operations. This can cause performance bottleneck, such as write amplification, the throughput degradation, accelerated wearing out, etc.

To solve this problem, embodiments described herein enhance the performance of a storage device using an integrated and on-chip accumulation buffer. The controller of the storage device can include a high-performance accumulation buffer that can operate at the rate of the storage device. In some embodiments, the accumulation buffer can be a resistive random-access memory (RRAM or ReRAM). If the controller receives a page from the host of an application for writing in the storage device, the controller stores the page in the accumulation buffer. When the buffer accumulates sufficient pages to complete one block, the controller transfers that block to the storage device (e.g., to the NAND flash).

Since the accumulation buffer can be non-volatile, the data stored in the accumulation buffer does not disappear in case of a power loss. Therefore, when the data is written into the accumulation buffer, the controller can consider the data as safely stored and send an acknowledgment to the host indicating that the data storage has been completed. In this way, the incoming data is organized in the unit of a block instead of a page. As a result, the incoming data segment size can become one block and its multiples for the storage device even when the host continues to provide read/write instructions based on the unit of page. This symmetry in data storage and erasure unit reduces the internal read/write operation and improves the performance of the storage device.

The term "distributed storage system" refers to a set of storage servers reachable via a network, such as a data center network. A respective such storage server can include one or more storage devices.

A "host" or a user associated with a host refers to an entity which communicates with a distributed storage system via a network, such as the Ethernet.

The term "application" refers to an application running on a host, which can issue an Input/Output (I/O) request to a distributed storage system.

The term "storage cluster" refers to a group of storage servers.

The term "storage server" refers to a server in a distributed storage system. A storage server can have multiple disks, where data may be written on to a disk for persistent storage. A disk can receive data directly from a client server (or a client-serving machine). A disk can also include a storage, storage medium, or other storage means associated with the disk.

Exemplary System

FIG. 1A illustrates an exemplary distributed storage system facilitating enhanced data storage management, in accordance with an embodiment of the present application. In this example, a computing device 102, which is associated with a user 104, relies on distributed storage system 100 for storing data. Examples of computing device 102 can include, but are not limited to, a tablet, a mobile phone, an electronic reader, a laptop computer, a desktop computer, and any other computing device. Computing device 102 can communicate via a network 110 with servers 112, 114, and 116, which can be part of distributed storage system 100.

Servers 112, 114, and 116 can be storage servers, each of which can include a CPU, an interface card, and storage devices or modules. For example, server 116 can include a central processing unit (CPU) 122, a memory 124, a network interface card (NIC) 126, and a number of high-performance storage devices 132, 136, and 140. In some embodiments, a storage device can be an SSD. Storage devices 132, 136, and 140 can have controllers 134, 138, and 142, respectively. An SSD can include non-volatile memory, including multiple non-volatile memory dies. A non-volatile memory die can be a NAND die.

With existing technologies, to support legacy applications, a storage device, such as storage device 140, can read and/or write data with the unit of a page (e.g., 16 KB). However, controller 142 can physically erase data with the unit of a block (e.g., 4 MB). Since NAND-based storage may not support in-place overwrite for a page, if a page 172 is updated in a block 152, controller 142 rewrites the updated data in a new page and marks page 172 as an invalid page. Since block 152 still includes valid pages, such as page 174, block 152 remains operational and continues to store valid data. As a result, controller 142 may continue to maintain invalid page 172 and valid page 174 in block 152, and may not physically erase and release page 172 as a free page for future write operations.

As a result, a large number of blocks 152, 154, 156, and 158 can be used in storage device 140, and many such blocks can include both valid and invalid pages. To free block 152, controller 142 can trigger a garbage collector, which collects a respective valid page, such as page 174, in block 152 and writes page 174 to another block, such as block 156. The garbage collector then marks page 174 in block 152 as invalid. When all valid pages are moved from block 152, controller 142 determines block 152 to be a free block and adds block 152 to the free block pool of storage device 140.

However, this process can lead to background read/write operations in storage device 140. When any external operation, such as a read/write request from an application on computing device 102, arrives at storage device 140, the background read/write operations share the total bandwidth and storage management capacity of storage device 140 with the external operation. This can cause performance bottleneck, such as write amplification, throughput degradation, accelerated wearing out, etc., for storage device 140.

To solve this problem, embodiments described herein enhance the performance of storage device 140 by integrating an on-chip high-performance accumulation buffer 150. Controller 142 can include buffer 150 that can operate at the rate of storage device 140. In some embodiments, buffer 150 can be a ReRAM-based buffer. During operation, controller 142 receives a page 170 in a write request from device 102 for writing in storage device 140. Controller 142 stores page 170 in buffer 150. Since buffer 150 can be non-volatile, the data stored in buffer 150 does not disappear in case of a power loss. Therefore, when page 170 is written into buffer 150, controller 142 can consider page 170 to be safely stored and send an acknowledgment to the host indicating that the write operation for page 170 has been completed.

When buffer 150 accumulates sufficient pages to complete a block 130, controller 142 transfers block 130 to data block 158 in storage device 140. In this way, even when the incoming data arrives as a page, controller 142 organizes the incoming data in the unit of a block 130. As a result, the incoming data segment size can become one block and its multiples for storage device 140 even when a host continues to provide read/write instructions based on the unit of a page. Controller 142 thus utilizes this symmetry in data storage unit and erasure unit for storage device 140 to reduce the internal read/write operations for storage device 140, thereby improving the performance of storage device 140.

Figure 1B:
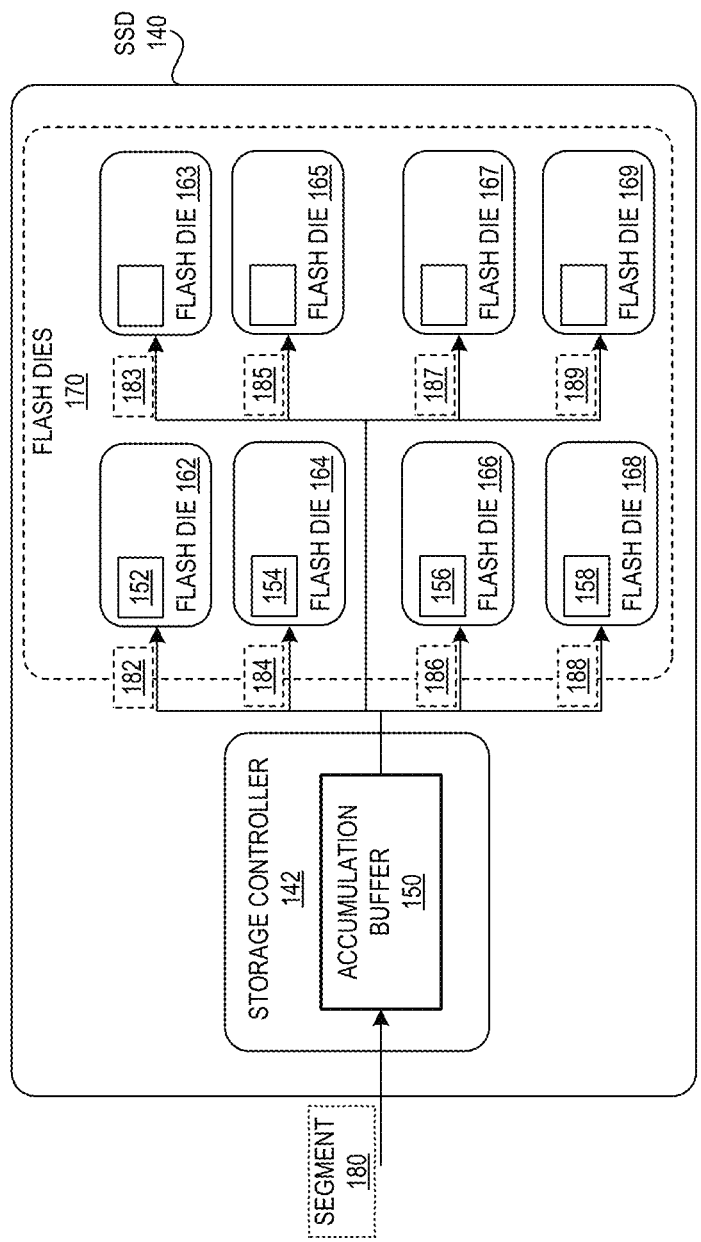
FIG. 1B illustrates an exemplary storage device facilitating enhanced data storage management, in accordance with an embodiment of the present application.

FIG. 1B illustrates an exemplary storage device facilitating enhanced data storage management, in accordance with an embodiment of the present application. In this example, storage device 140 can include one or more flash dies 170 (e.g., NAND dies). A die can be a small block of semiconducting material on which a given functional circuit is fabricated. To improve the performance, storage device 140 can include a number of channels, each of which can communicate with a corresponding flash die. For example, storage device 140 can include 8 flash dies 162, 163, 164, 165, 166, 167, 168, and 169. Data blocks 152, 154, 156, and 158 can be in flash dies 162, 164, 166, and 168, respectively. To ensure efficient communication, storage device 140 can include 8 channels to the dies from controller 142.

With existing technologies, to write a large data segment 180, (e.g., a segment of 256 KB), controller 142 can divide segment 180 into smaller segments (e.g., a page-sized segment with 16 KB) and transfer the smaller segments into multiple channels (e.g., 8 channels), so that 8×16=256 KB is written simultaneously into flash dies 170. To do so, controller 142 interleaves the sequential 256 KB data segment into the 8 flash dies. Consequently, the physical locations holding the data are not sequential in terms of physical address. Since data segment 180 is divided and spread into different dies, the unit of each write operation on a flash die is still based on a page. Hence, a storage device with performance enhancement using multiple channels may still face the same issues, such as write amplification and performance vibration.

To solve this problem, controller 142 can store data segment 180 in buffer 150. Since storage device 140 supports 8 channels, buffer 150 can include at least 8 blocks (e.g., 32 MB) 182, 183, 184, 185, 186, 187, 188, and 189. When buffer 150 accumulates sufficient data to complete these eight blocks, controller 142 transfers blocks 182, 183, 184, 185, 186, 187, 188, and 189 via the 8 channels to flash dies 162, 163, 164, 165, 166, 167, 168, and 169, respectively. As a result, even with multiple channels, the incoming data segment size for each flash die remains one block. Controller 142 thus utilizes the multiple channels in storage device 140 to increase the internal throughput for storage device 140.

Efficient Data Storage

Figure 2A:
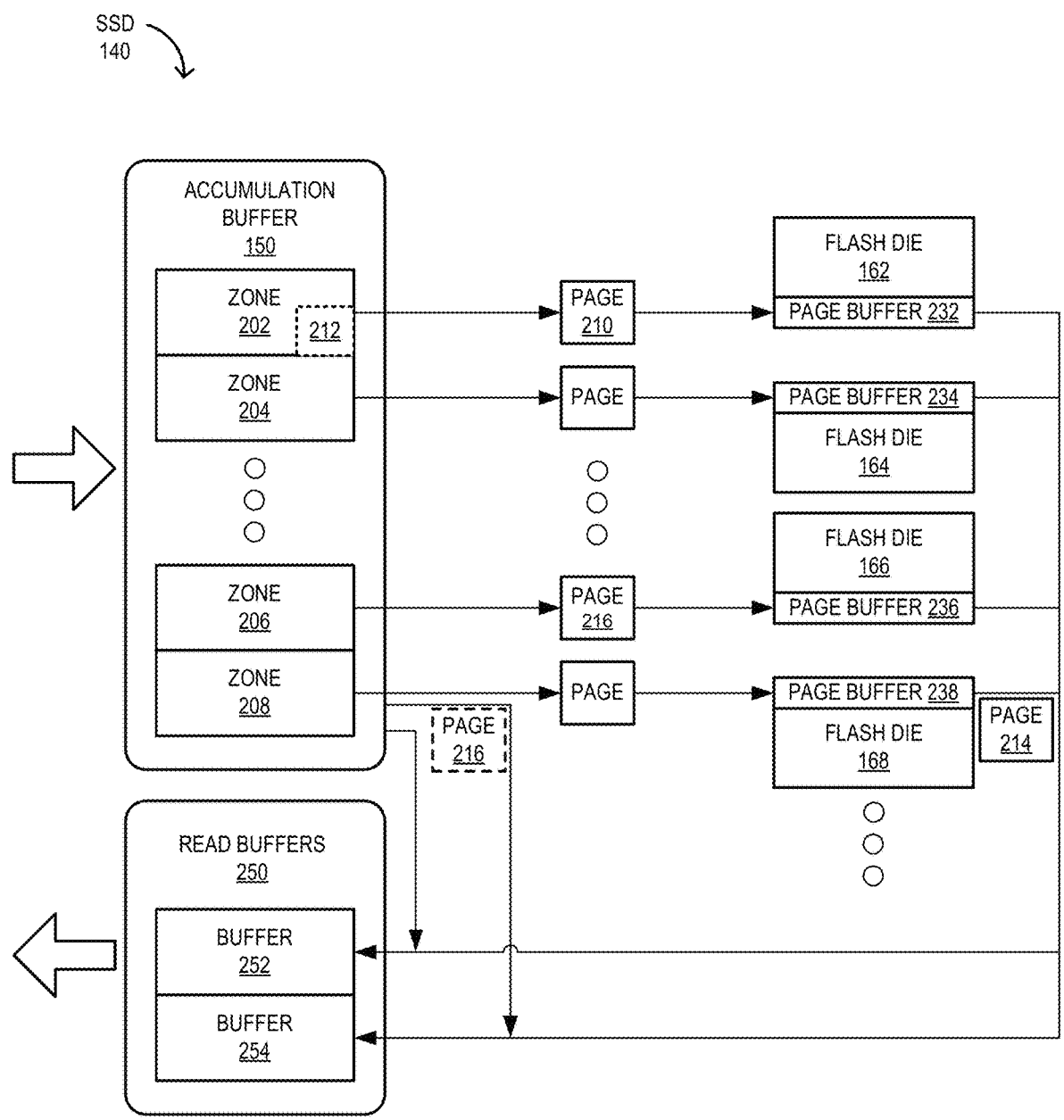
FIG. 2A illustrates an exemplary enhanced storage device facilitating efficient data storage and retrieval, in accordance with an embodiment of the present application.

FIG. 2A illustrates an exemplary enhanced storage device facilitating efficient data storage and retrieval, in accordance with an embodiment of the present application. Buffer 150 can mostly operate as a write buffer, which is used for accumulating data pages arriving at storage device 140 for writing. In some embodiments, buffer 150, which can be a ReRAM, can be integrated with controller 142 during the application-specific integrated circuit (ASIC) design (e.g., as a non-volatile module in the system-on-chip (SoC)). Since storage device 140 can include multiple channels, buffer 150 can include multiple zones 202, 204, 206, and 206 to accommodate multiple blocks, each zone corresponding to a channel.

A respective channel corresponds to a flash die in storage device 140. Hence, each zone of buffer 150 corresponds to a flash die. When a data segment arrives at storage 140, controller 142 stores the data segment in a zone, such as zone 202, and acknowledges to the host that the segment has been successfully written. Depending on the storage policy, controller 142 can store subsequent data segments in the same zone 202 until at least one block of data is accumulated, or can distribute the data across zones 202, 204, 206, and 208. This storage policy can allow controller 142 to accumulate data in a single zone, or spread data across the zones. The storage policy ensures that the sequential data in the data segment are sequentially stored in storage device 140.

When zone 202 accumulates enough data for one block (e.g., 4 MB), controller 142 transfers data from zone 202 to flash die 162. In some embodiments, flash die 162 includes a page buffer 232 that stores an incoming page. Controller 142 then transfers data from zone 202 to page buffer 232 of flash die 162 one page at a time. Controller 142 then transfers the page from the flash buffer to flash die 162. This includes programming flash die 162 to store the page in a free block in flash die 162. For example, controller 142 transfers page 210 from zone 202 to page buffer 232. The transferred data is programmed in flash die 162 with an order of arrival in page by page as well. As a result, sequential data in zone 202 is stored in the same sequence in flash die 162. Similarly, flash dies 164, 166, and 168 include page buffers 234, 236, and 238, respectively. When one block of data is accumulated, controller 142 transfers data from zones 204, 206, and 208 to page buffers 234, 236, and 238, respectively, one page at a time.

Unlike NAND-based flash dies, ReRAM supports in-place overwrite with low latency. As a result, when controller 142 successfully writes page 210 in flash die 162, the corresponding physical cells 212 in buffer 150 can accommodate any new data arriving at storage device 140. In this way, buffer 150 supports direct in-place update and does not need a separate erase operation to clear its contents. When buffer 150 is not full, the throughput for the write operations depends on the capacity of the channels between zones 202, 204, 206, and 208, and flash dies 162, 164, 166, and 168, respectively. For example, if the channels are based on Peripheral Component Interconnect Express (PCIe) interface, the throughput of the write operations depends on the performance of the PCIe interfaces, and buffer 150 is not the bottleneck. On the other hand, when buffer 150 is full, all channels can be active for writing data into the flash dies, and the throughput of the write operations depends on the flash dies' inherent processing capability. Therefore, for either scenario, buffer 150 can maintain high throughput that is not lower than a conventional storage device.

In some embodiments, controller 142 can include dedicated read buffers 250 for read operations. Read buffers 250 can be implemented using static random-access memory (SRAM) or flip-flops. Read buffers 250 can include a number of buffers 252 and 254. Since the host can continue to issue read requests in the unit of a page, controller 142 can obtain a page from the flash dies. For example, in response to receiving a request for a page 214, which is stored in flash die 168, controller 142 can obtain page 214 from page buffer 238 and stores page 214 in buffer 252. Controller 142 then provides page 214 to the host requesting page 214. Even though the write unit for storage device 140 is the unit of a block, controller 142 can facilitate page 214 in a format supported by the file system (e.g., EXT4, XFS, etc.) of the requesting host, and in the unit of a page. It should be noted that read buffers 250 are used for holding read results temporarily, which does not conflict with the data write operations in buffer 150.

Since controller 142 does not need to erase data from buffer 150 separately and facilitate in-place updates in buffer 150, a data page 216 can remain in buffer 150 after it has been written into flash die 166. Controller 142 may only update the corresponding location in buffer 150 by over-writing page 216 when a new data page arrives. Therefore, if a host requests page 216, which has not been overwritten yet, a valid copy of page 216 can be in buffer 150 as well as flash die 166. Since the read latency of buffer 150 can be lower than that of flash die 166, controller 142 can obtain page 216 from buffer 150 instead of flash die 166 (denoted with dashed lines) and store page 216 in buffer 252 (or 254).

Figure 2B:
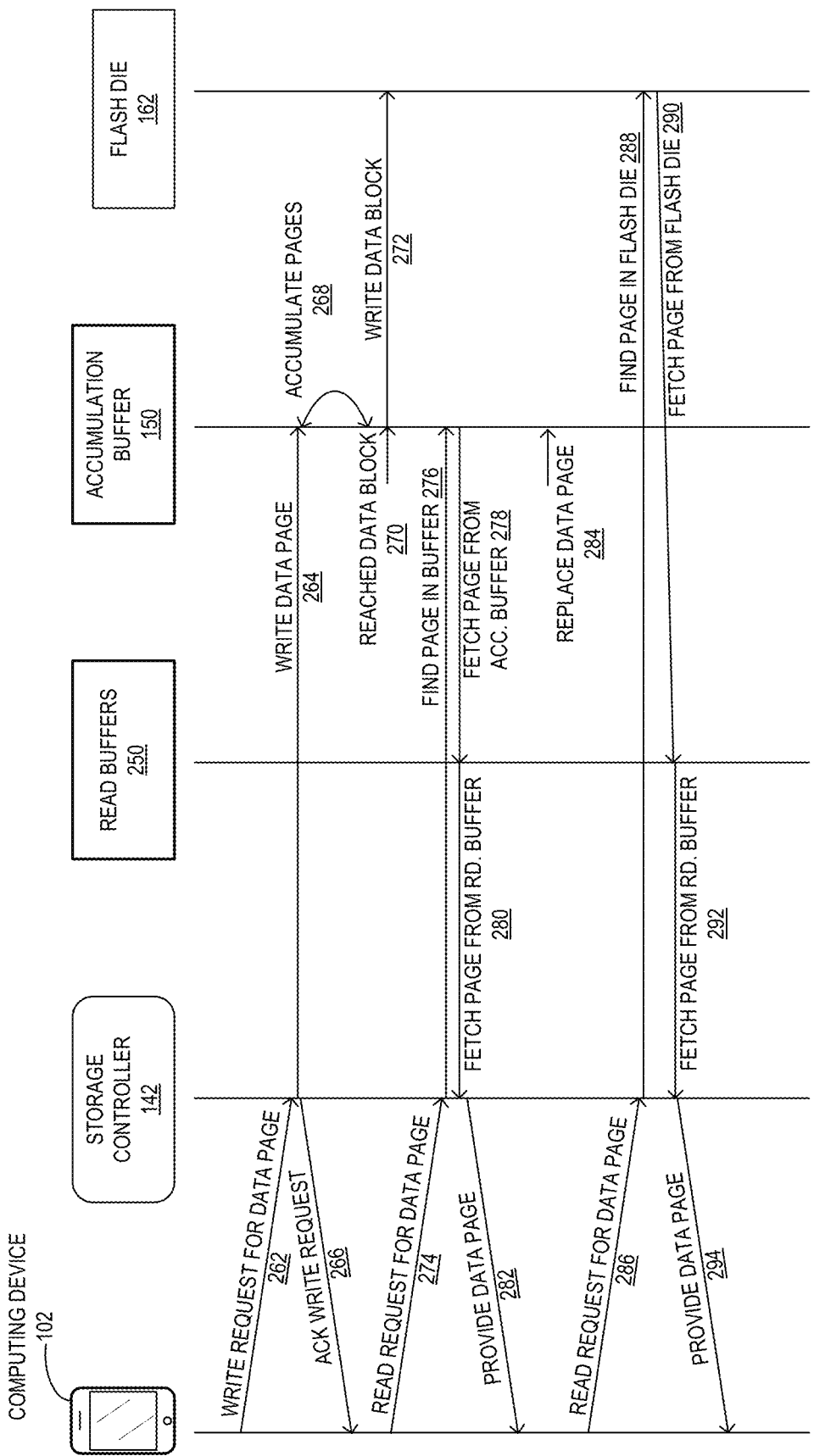
FIG. 2B illustrates an exemplary data storage and retrieval process for an enhanced storage device, in accordance with an embodiment of the present application.

FIG. 2B illustrates an exemplary data storage and retrieval process for an enhanced storage device, in accordance with an embodiment of the present application. During operation, controller 142 receives a wire request for a data page from computing device 102 (operation 262). Since buffer 150 is non-volatile, controller 142 writes the data page in buffer 150 (operation 264) and sends an acknowledgment for the write request to computing device 102 (operation 266). Controller 142 can continue to accumulate pages in buffer 150 (operation 268). However, upon receiving the acknowledgment, computing device 102 can consider the data page to be successfully written.

Controller 142 continues to accumulate pages (operation 268) until the buffer gathers sufficient pages to reach a data block (operation 270). Controller 142 then writes the data block from buffer 150 to flash die 162 (operation 272). However, until some new data arrives, the data remains in buffer 150. Hence, when controller 142 receives a read request for the page that has been stored in buffer 150 from computing device 102 (operation 274), controller 142 finds the data page in buffer 150 (operation 276). Controller 142 fetches the data page from buffer 150 into read buffers 250 (operation 278), fetches the data page from read buffers 250 (operation 280), and provides the data page to computing device 102 from read buffer 250 (operation 282).

However, when some new data arrives, controller 142 replaces the data page in buffer 150 (operation 284). Hence, the only copy of the data page is in flash die 162. When controller 142 receives another read request for the page from computing device 102 (operation 286), controller 142 then finds the data page in flash die 162 (e.g., based on a mapping to the page) (operation 288). Controller 142 fetches the data page from flash die 162 into read buffers 250 (operation 290), fetches the data page from read buffers 250 (operation 292), and provides the data page to computing device 102 from read buffer 250 (operation 294).

Storage Mappings

Figure 3:
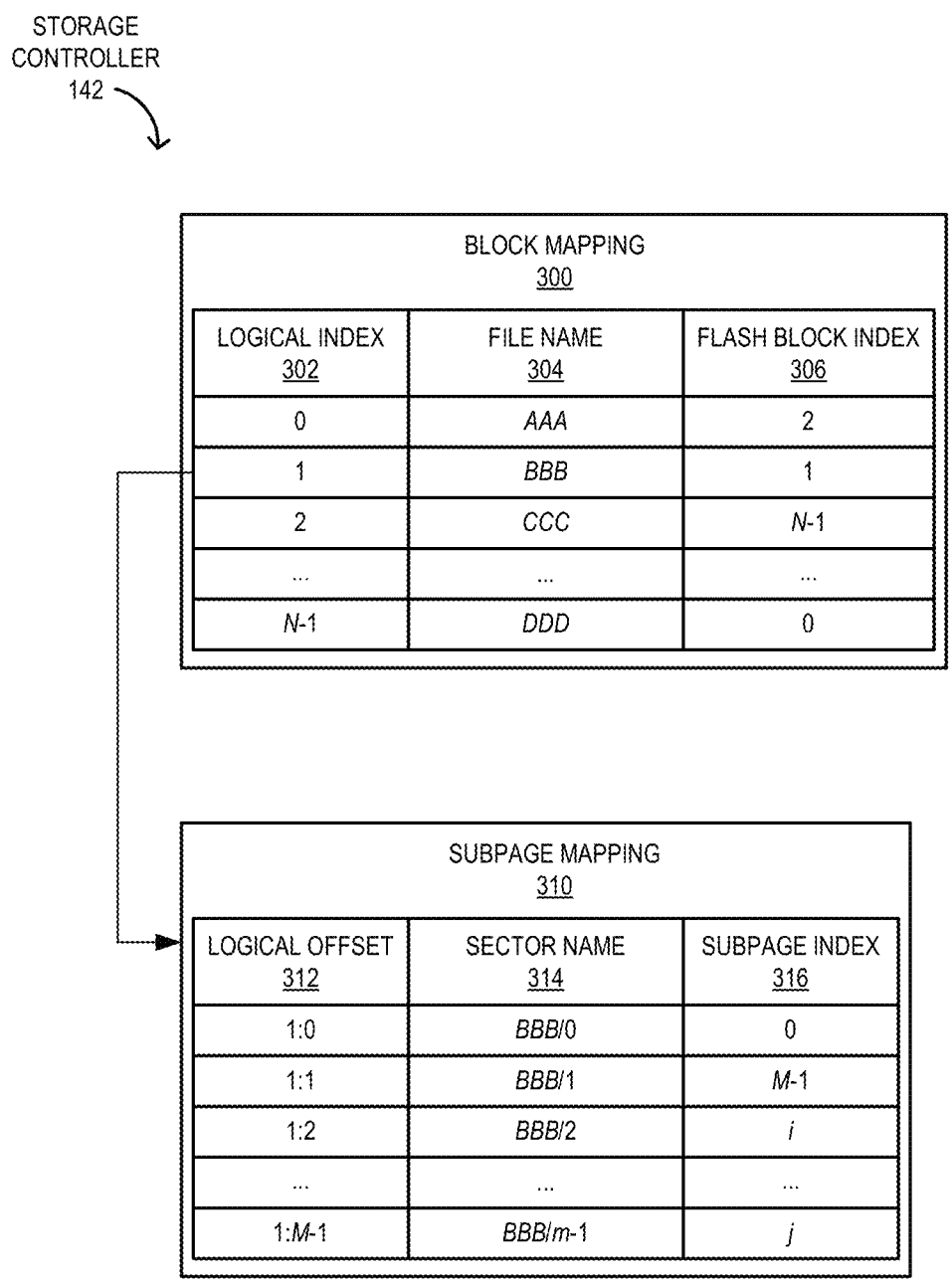
FIG. 3 illustrates an exemplary multi-level mapping for identifying data in an enhanced storage device, in accordance with an embodiment of the present application.

FIG. 3 illustrates an exemplary multi-level mapping for identifying data in an enhanced storage device, in accordance with an embodiment of the present application. Since data is written in the unit of a block in a storage device, the block may include pages from different applications. To ensure access to a respective data block and a page in the data block, a two-level mapping is maintained with offset calculation. The first level mapping is a block mapping 300, which facilitates the mapping at the block level (e.g., 4 MB). The second level mapping is a subpage mapping 310, which facilitates mapping within a block with the smallest unit in which a piece of data can be stored or retrieved. In some embodiments, the smallest unit can be a subpage (e.g., a data segment of 4 KB). A page can include a number of subpages. For example, one 16 KB page can include 4 subpages.

In some embodiments, controller 142 represents a respective block of data stored in the storage device as a logical file with a filename and presents the block as the logical file to the corresponding application(s). Controller 142 also generates a logical index for that data block and maps the filename and the logical index to the physical block index in the flash dies storing the block. For example, controller 142 can map a logical index 0 and a corresponding filename "AAA" to a physical block index 2. Similarly, controller 142 can map logical indices 1, 2, . . . , N-1 and corresponding filenames "BBB," "CCC," . . . , "DDD" to physical block indices 1, N-1, . . . , 0, respectively, storing the physical blocks. A block index uniquely identifies a block in a storage device. As a result, if a block index k is the final block index in one flash die, block index k+1 can be the first block index in the next flash die.

Controller 142 can also maintain subpage mapping 310 to facilitate data read within a block. In mapping 300, filename "BBB" is associated with logical index 1. The data content of "BBB" can be stored into the physical block corresponding to index 1. On the other hand, filename "CCC" is associated with logical index 2. The data content of "CCC" can be stored into the physical block corresponding to index N-1. Therefore, the order of the logical indices and the physical indices can be different. Here, the order of the logical indices can be based on the arrival of data. On the other hand, the physical block indices can correspond to the available data blocks.

Controller 142 can also maintain subpage mapping 310 to facilitate data read within a block. A file can include a number of sectors, each of which can correspond to the smallest unit accessible via a read instruction. If the unit is a subpage, each sector corresponds to a subpage. In this example, logical file "BBB" includes m logical sectors "BBB/0," "BBB/1," "BBB/2," . . . , "BBB/m-1." The logical index associated with each sector can be referred to as a logical offset, and expressed based on the logical index 1 of file "BBB." For example, sectors "BBB/0," "BBB/1," "BBB/2," . . . , "BBB/m-1" are associated with logical offsets 1:0, 1:1, 1:2, . . . , 1:m-1, respectively. Based on the sequence in which a respective sector is stored into the data block in a flash die (e.g., page by page), mapping 310 maps a respective sector of logical file "BBB" to a corresponding physical index storing the subpage. Mapping 310 maps logical offsets 1:0, 1:1, 1:2, . . . , 1:m-1 to subpage indices 0, M-1, i, . . . , j, respectively. Here, the subpage indices indicate the data placement locations at the subpage-level.

Using the hierarchical addressing in the two-level mapping, which includes mappings 300 and 310, a read request can access a data segment at the sub-page level. Using the filename of a logical file, controller 142 can determine the corresponding block index from mapping 300. Controller 142 then can locate a respective sector based on the logical offset from mapping 310. For example, to access sector "BBB/2," controller 142 can obtain filename "BBB" and retrieve logical index 1 and corresponding block index 1 from mapping 300. Controller 142 then retrieves logical offset 1:2 and block index i associated with "BBB/2" from mapping 310. Controller 142 can then obtain the ith subpage stored in the block associated with index 1.

Block-Level Read, Write, and Refresh

Figure 4A:
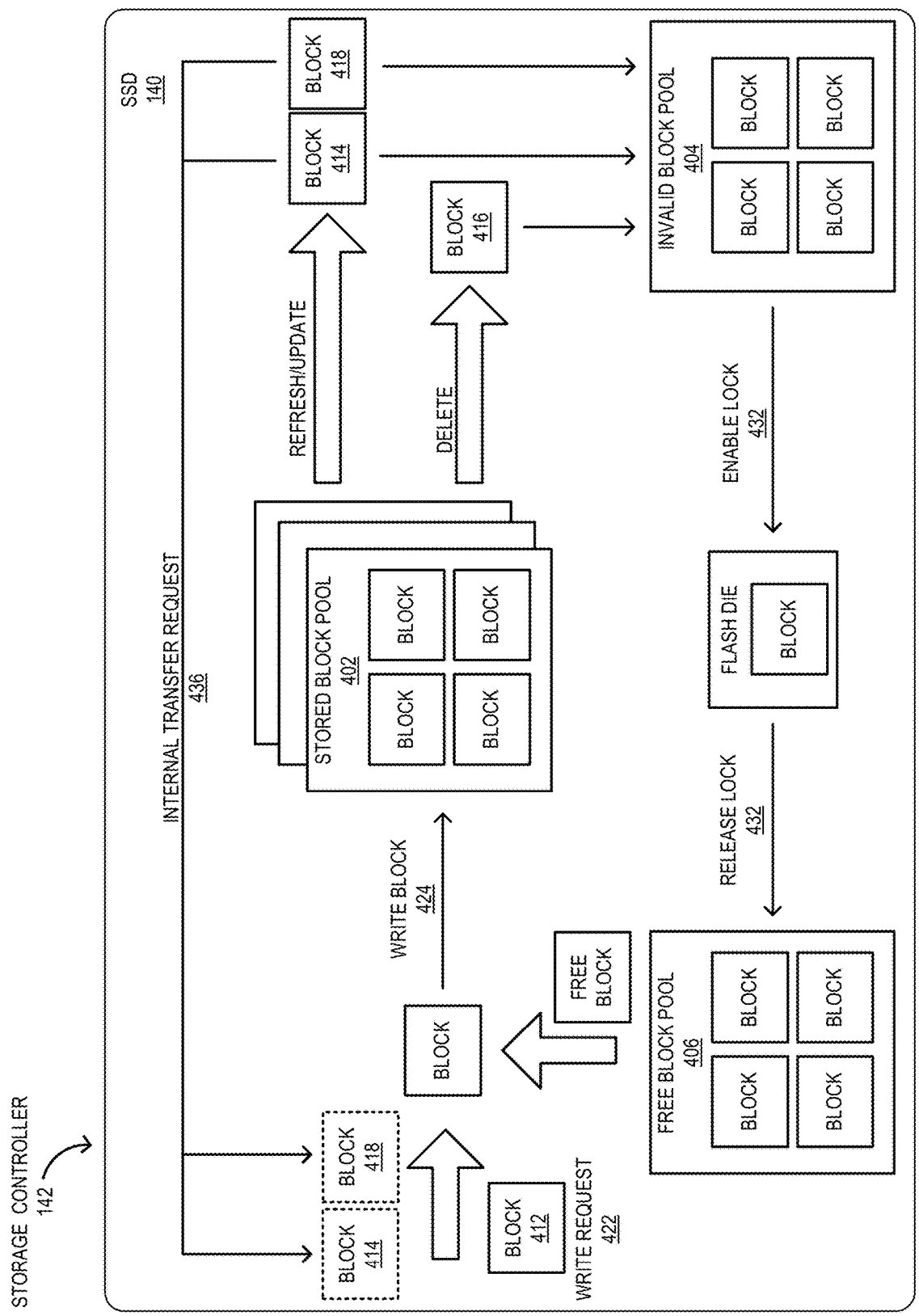
FIG. 4A illustrates exemplary operations in an enhanced storage device based on a unit of a block, in accordance with an embodiment of the present application.

FIG. 4A illustrates exemplary operations in an enhanced storage device based on a unit of a block, in accordance with an embodiment of the present application. During operation, when storage device 140 initializes (e.g., powers up), a respective block in storage device 140 is in a free block pool 406 and ready to store data. When a write request 422 associated with a data block 412 arrives at storage device 140, controller 142 obtains a free block. Controller 142 allocates block 412 to the free block based on the two-level mapping described in conjunction with FIG. 3. Controller 142 then executes a write operation 424 that writes data block 412 into the free block. After the write operation is completed to the block, which is not a free block any more, the block is allocated to a stored block pool 402, which represents the set of blocks storing valid data.

When more and more data blocks are stored, controller 142 continues to move more blocks from free block pool 406 to stored block pool 402. It should be noted that data blocks in storage device 140 (e.g., the NAND cells) are affected by the read operations as well, which can be referred to as a read disturb. Moreover, a respective block in stored block pool 402 can face data degradation. Typically, NAND cells are configured to have 90 days of data retention. Therefore, a respective block in stored block pool 402 needs to be refreshed after the block reaches an alarm zone (e.g., retains data close to 90 days without refreshing).

To ensure that data is safely retained, controller 142 periodically evaluates the data for the blocks in stored block pool 402. Upon determining that block 414 in stored block pool 402 is in the alarm zone, controller 142 initiates an internal transfer request 436 to refresh block 414. Controller 142 reads block 414 from stored block pool 402. Controller 142 obtains a free block from free block pool 406 and executes a write operation 424 that writes data block 414 (denoted with dashed lines) into the free block. In this way, controller 142 refreshes the entire block. Upon completing the refresh operation, controller 142 adds the refreshed block, which was the free block, to stored block pool 402. Controller 142 then considers old block 414 as an invalid block, which can be erased to generate a free block.

Furthermore, the content of a block in stored block pool 402 may become expired because the block can be updated or deleted. For example, if the subpages of a block 416 in stored block pool 402 expire because the subpages are deleted, controller 142 considers block 416 as an invalid block, which can also be erased to generate a free block.

On the other hand, if controller 142 receives an update request for a block 418, controller 142 initiates an internal transfer request 436 to update block 418. Controller 142 reads block 418 from stored block pool 402 and transfers the data to buffer 150. Controller 142 then updates the data in buffer 150 based on the update request. Controller 142 obtains a free block from free block pool 406 and executes a write operation 424 that writes data block 418 (denoted with dashed lines) into the free block. Upon completing the update operation, controller 142 adds the updated block, which was the free block, to stored block pool 402. Controller 142 then considers old block 418 as an invalid block, which can be erased to generate a free block.

In the case of the updated, refreshed, and deleted block, controller 142 can update the corresponding two-level mapping, as described in conjunction with FIG. 3. Controller 142 then adds blocks 414, 416, and 418 to an invalid block pool 404, which stores the blocks that are invalid but have not been erased yet. To erase a block from invalid block pool 404, controller 142 can enable a lock 432 on the flash die that includes the block. The locked die cannot service any incoming read and/or write operation until the erase operation is completed. If a read and/or write operation arrives for the block, that operation can be redirected to another replica of the data stored in another storage device in the distributed storage system. In the example in FIG. 1A, if a flash die of a storage device in server 116 is locked, any corresponding read and/or write operation can be redirected to another server 112/114 that stores another replica of the data associated with the operation. Upon erasing the block, controller 142 releases lock 432 and adds the block to free block pool 406. The erasure operation on the block removes the invalid and expired data from the block.

In some embodiments, storage device 140 may not include any power loss protection. Regardless of a write or a refresh operation, controller 142 does not commit data until controller 142 writes the data into buffer 150. Hence, storage device 140 no longer needs to have the power loss protection, which reduces the corresponding overhead associated with circuitry, testing, firmware development, etc. This, in turn, can lower the cost and the reliability of storage device 140.

Figure 4B:
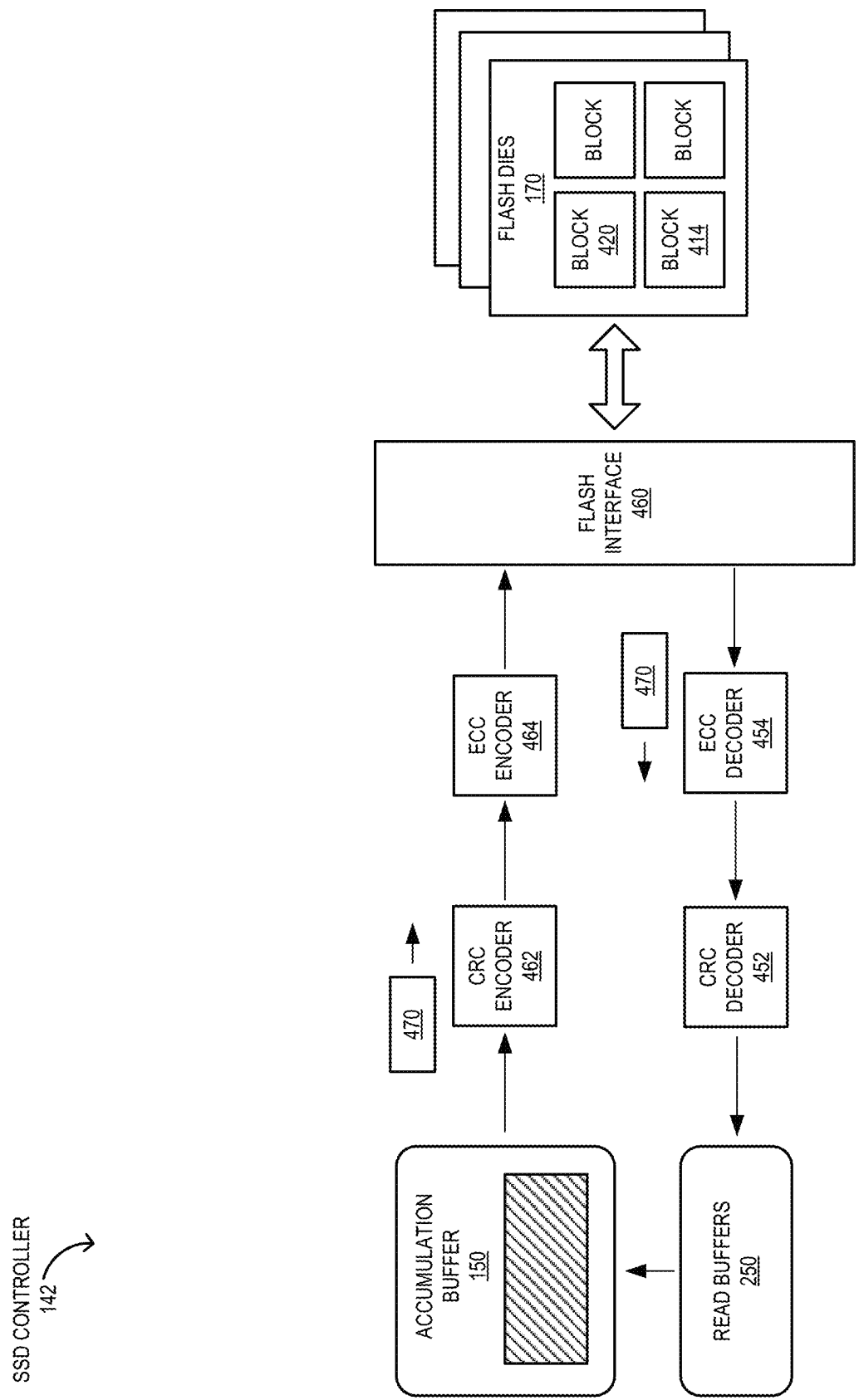
FIG. 4B illustrates an exemplary data refresh process for an enhanced storage device based on a unit of a block, in accordance with an embodiment of the present application.

FIG. 4B illustrates an exemplary data refresh process for an enhanced storage device based on a unit of a block, in accordance with an embodiment of the present application. To refresh block 414, controller 142 sequentially reads out a respective page from block 414 using a flash interface 460. In this example, flash interface 460 allows controller 142 to access a respective page. Controller 142 obtains page 470 from block 414 and decodes page 470 using an error-correcting code (ECC) decoder 454 to recover the correct data by fixing any error in page 470. Controller 142 then applies a cyclic redundancy check (CRC) using a CRC decoder 452 to check the data consistency of page 470. CRC decoder 452 can also ensure that ECC decoder 454 does not converge onto a wrong codeword, thereby ensuring that ECC decoder 454 does not yield an incorrect page.

Controller 142 transfers page 470 from CRC decoder 452 to read buffers 250. Controller 142 then transfers that page 470 to buffer 150. Controller 142 shortcuts page 470 through buffer 150 without waiting for accumulation of an entire block. Controller 142 obtains page 470 from buffer 150 and applies CRC using a CRC encoder 462 to check the data consistency of page 470 obtained from buffer 150. Controller 142 then encodes page 470 using an ECC encoder 464 to recover the correct data by fixing any error in page 470. Controller 142 then writes page 470 into a new free block 420 in flash dies 170. In this way, controller 142 refreshes the data in block 414 by sequentially repeating this read/write process page by page for each page within block 414.

In this way, embodiments described herein present storage device 140 with the on-chip buffer 150 integrated in controller 142. Storage device 140 allows block-by-block write operations, and simplifies the mapping between logical and physical entities. Controller 142 can efficiently operate storage device 140 without a separate garbage collector. Furthermore, storage device 140 may not require additional power loss protection. In addition, controller 142 can refresh data in storage device 140 at the block level, thereby significantly reducing the write amplification. The performance of storage device 140 can remain stable because the background operations rarely occur and occupy limited resources.

Operations

Figure 5A:
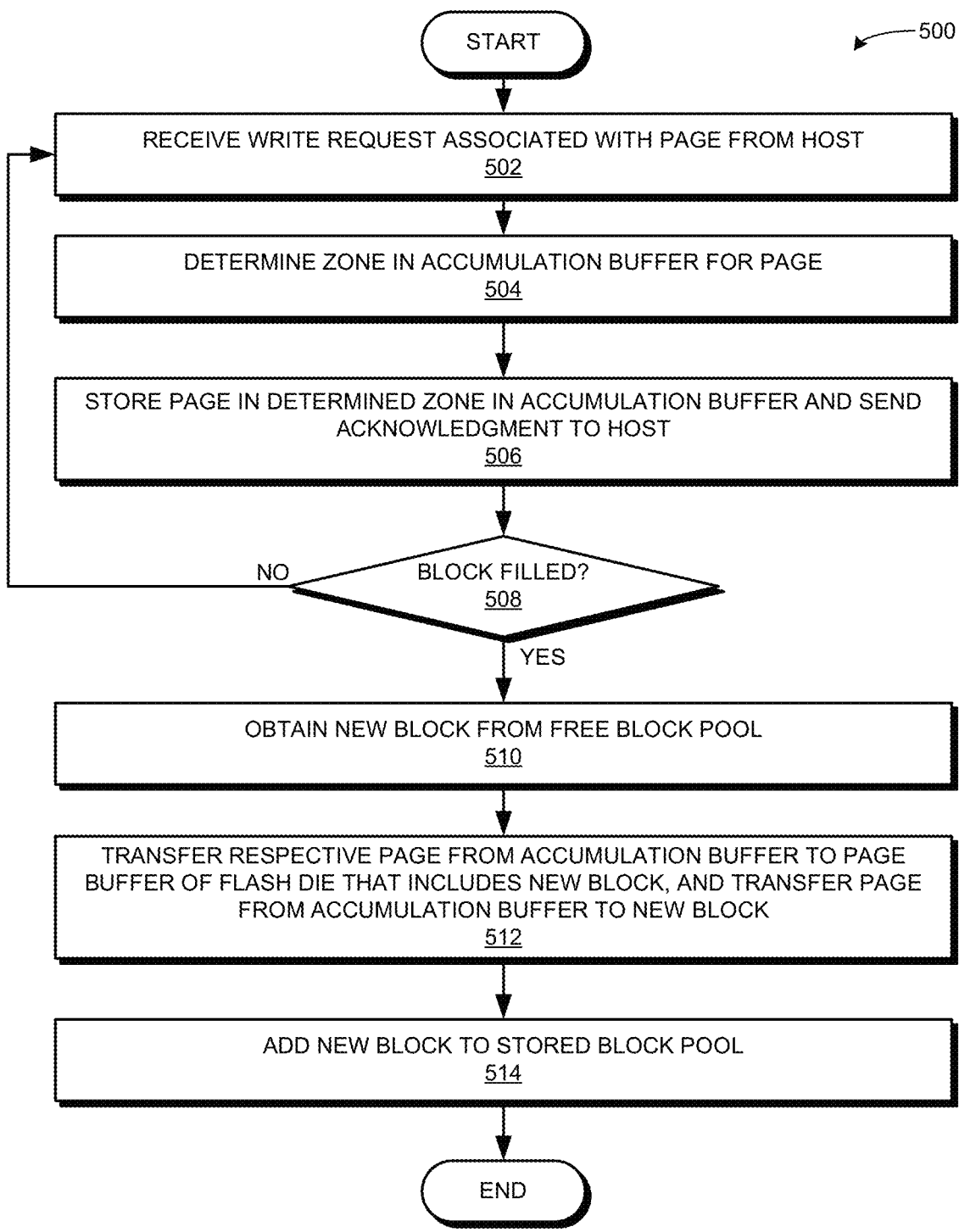
FIG. 5A presents a flowchart illustrating a method of a storage controller storing data in an enhanced storage device, in accordance with an embodiment of the present application.

FIG. 5A presents a flowchart illustrating a method 500 of a storage controller storing data in an enhanced storage device, in accordance with an embodiment of the present application. During operation, the controller receives a write request associated with a page from a host (operation 502) and determines a zone in the accumulation buffer for the page (operation 504). The controller can determine the zone to ensure that the sequential data is sequentially written. The controller then stores the page in the determined zone in the accumulation buffer and sends an acknowledgment to the host (operation 506). The controller checks whether the block has been filled (operation 508). If the block is not filled, the controller continues to receive a write request associated with a page from a host (operation 502).

On the other hand, if the block is filled, the controller obtains a new block from the free block pool (operation 510). The controller transfers a respective page from the accumulation buffer to the page buffer of the flash die that includes the new block, and transfers the page from the accumulation buffer to the new block (operation 512). The controller then adds the new block to the stored block pool (operation 514).

Figure 5B:
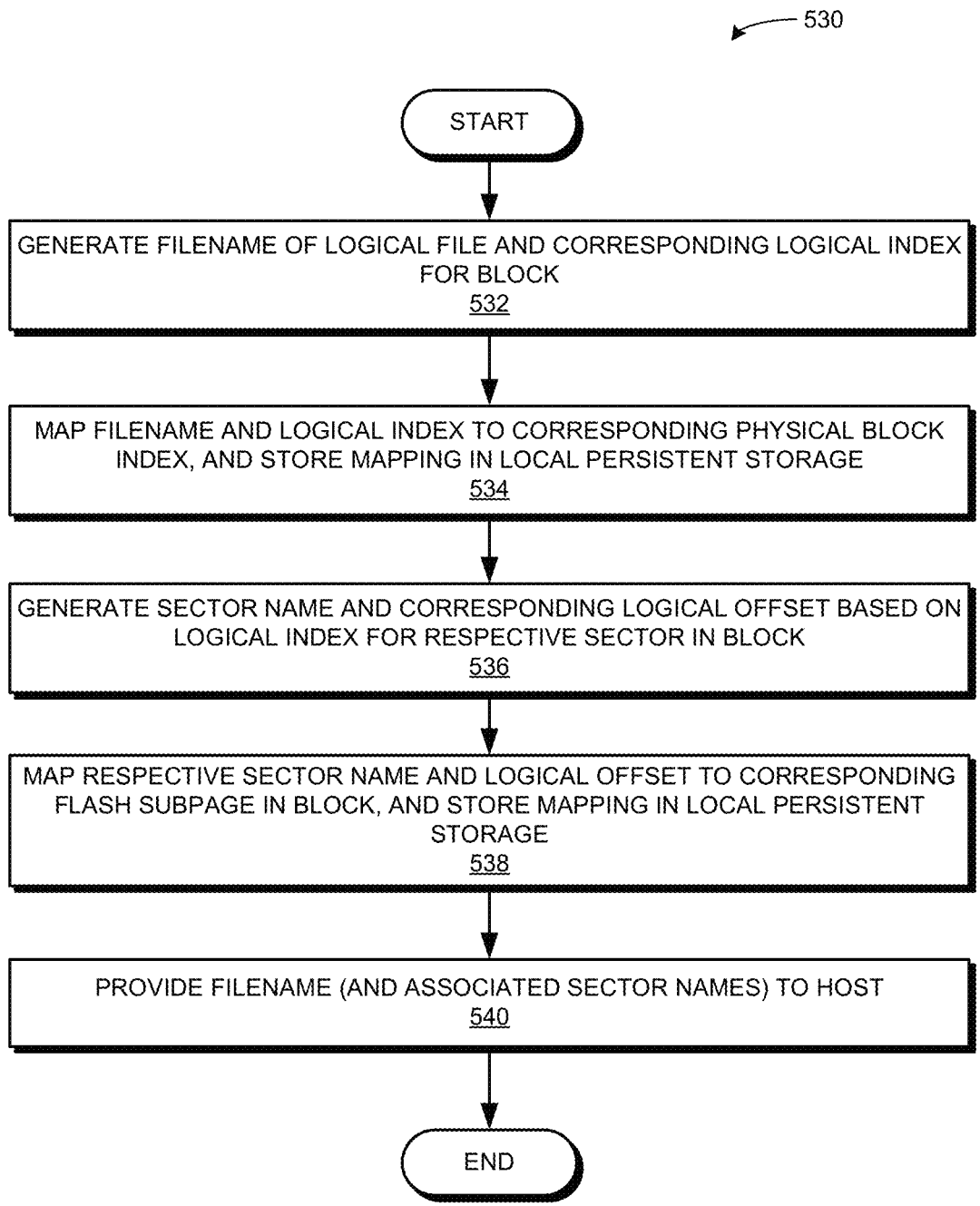
FIG. 5B presents a flowchart illustrating a method of a storage controller generating a multi-level mapping for storing data in an enhanced storage device, in accordance with an embodiment of the present application.

FIG. 5B presents a flowchart illustrating a method 530 of a storage controller generating a multi-level mapping for storing data in an enhanced storage device, in accordance with an embodiment of the present application. During operation, the controller generates a filename of the logical file and a corresponding logical index for a block (operation 532). The controller then maps the filename and the logical index to the corresponding physical block index, and stores the mapping in a local persistent storage (operation 534). The persistent storage can be a non-volatile storage.

The controller generates a sector name and a corresponding logical offset based on the logical index for a respective sector in the block (operation 536). The controller maps a respective sector name and the logical offset to the corresponding flash subpage in the block, and stores the mapping in the local persistent storage (operation 538). The controller then provides the file to the host (operation 540). In some embodiments, the controller can also provide the sector names associated with the filename to the host.

Figure 5C:
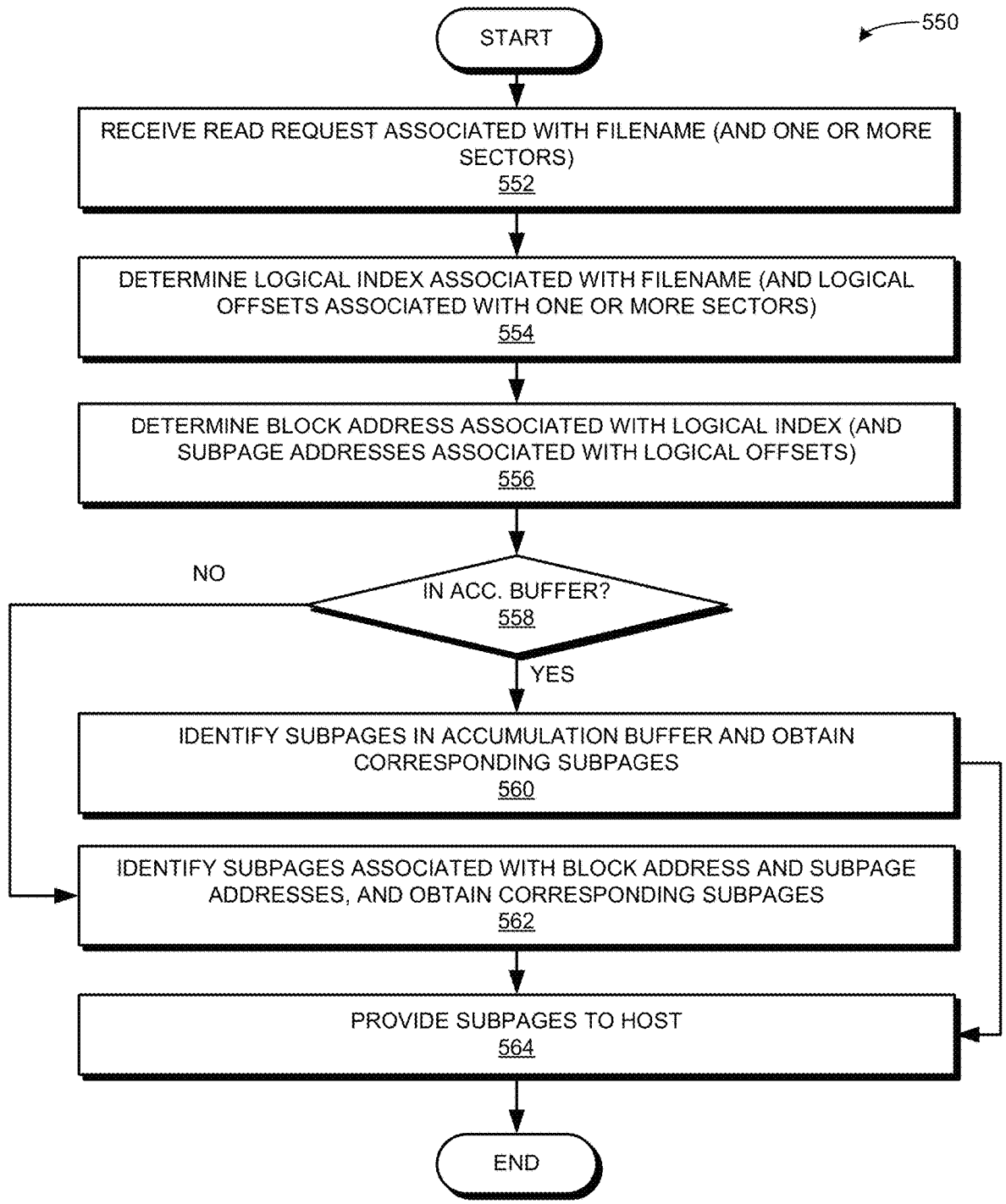
FIG. 5C presents a flowchart illustrating a method of a storage controller retrieving data from an enhanced storage device, in accordance with an embodiment of the present application.

FIG. 5C presents a flowchart illustrating a method 550 of a storage controller retrieving data from an enhanced storage device, in accordance with an embodiment of the present application. During operation, the controller receives a read request associated with a filename (operation 552). The read request can also include one or more sectors. The controller then determines a logical index associated with the filename (operation 554). The controller can also include the logical offsets associated with one or more sectors. The controller can determine the block address associated with the logical index (operation 556). The controller can also determine the subpage addresses associated with the logical offsets).

The controller checks whether the data associated with the read request is in the accumulation buffer (operation 558). If the accumulation buffer includes the data, the controller identifies the subpages in the accumulation buffer and obtains the corresponding subpages (operation 560). Otherwise, the controller identifies the subpages associated with the block address and subpage addresses, and obtains the corresponding subpages (operation 562). Upon obtaining the corresponding subpages (operation 560 or 562), the controller provide the subpages to the host (operation 564).

Figure 6A:
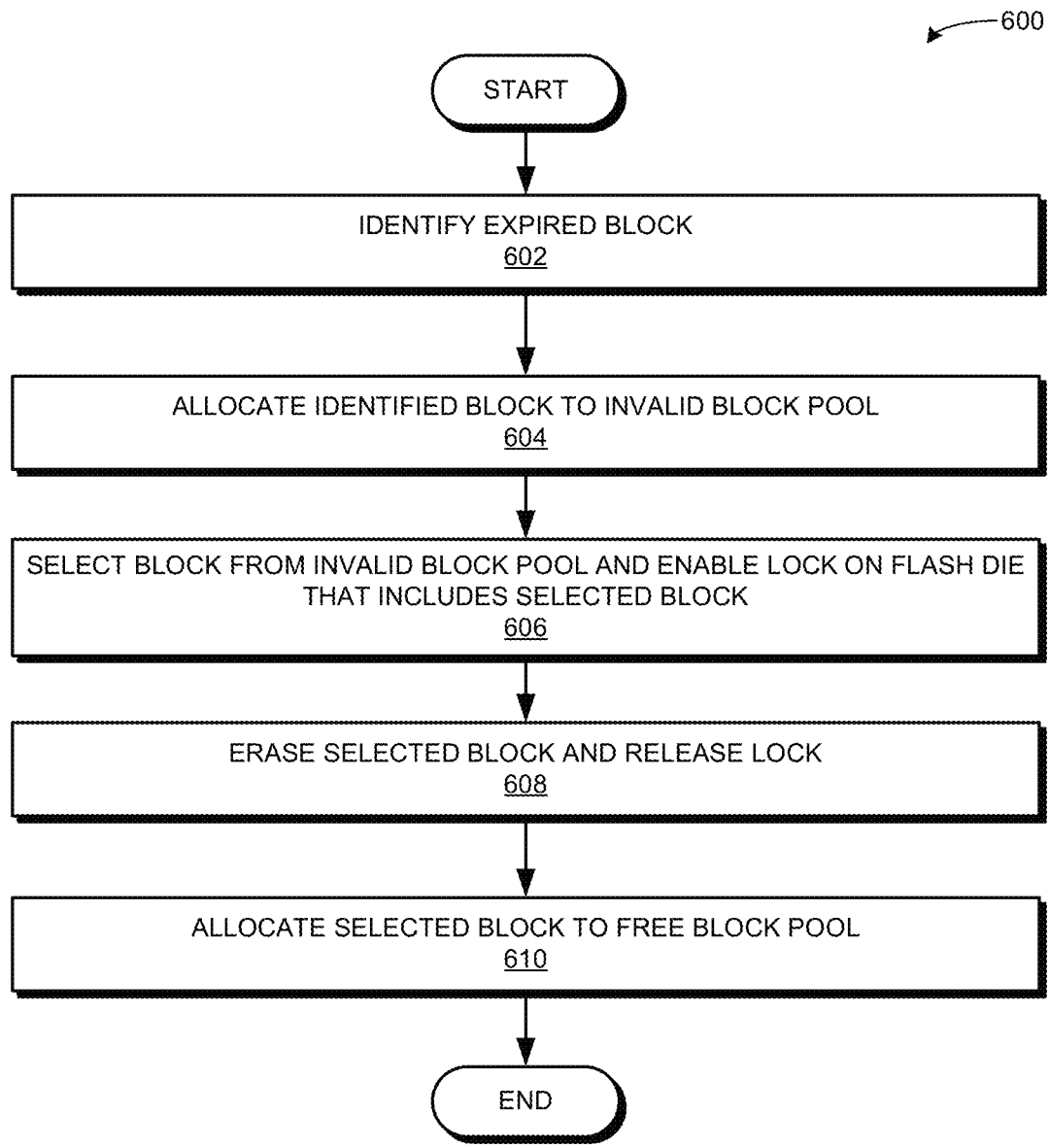
FIG. 6A presents a flowchart illustrating a method of a storage controller erasing a block in an enhanced storage device, in accordance with an embodiment of the present application.

FIG. 6A presents a flowchart illustrating a method 600 of a storage controller erasing a block in an enhanced storage device, in accordance with an embodiment of the present application. During operation, the controller identifies an expired block (operation 602) and allocates the identified block to an invalid block pool (operation 604). The controller selects a block from the invalid block pool and enables a lock on the flash die that includes the selected block (operation 606). The controller then erases the selected block and releases the lock (operation 608). The controller allocates the selected block to the free block pool (operation 610).

Figure 6B:
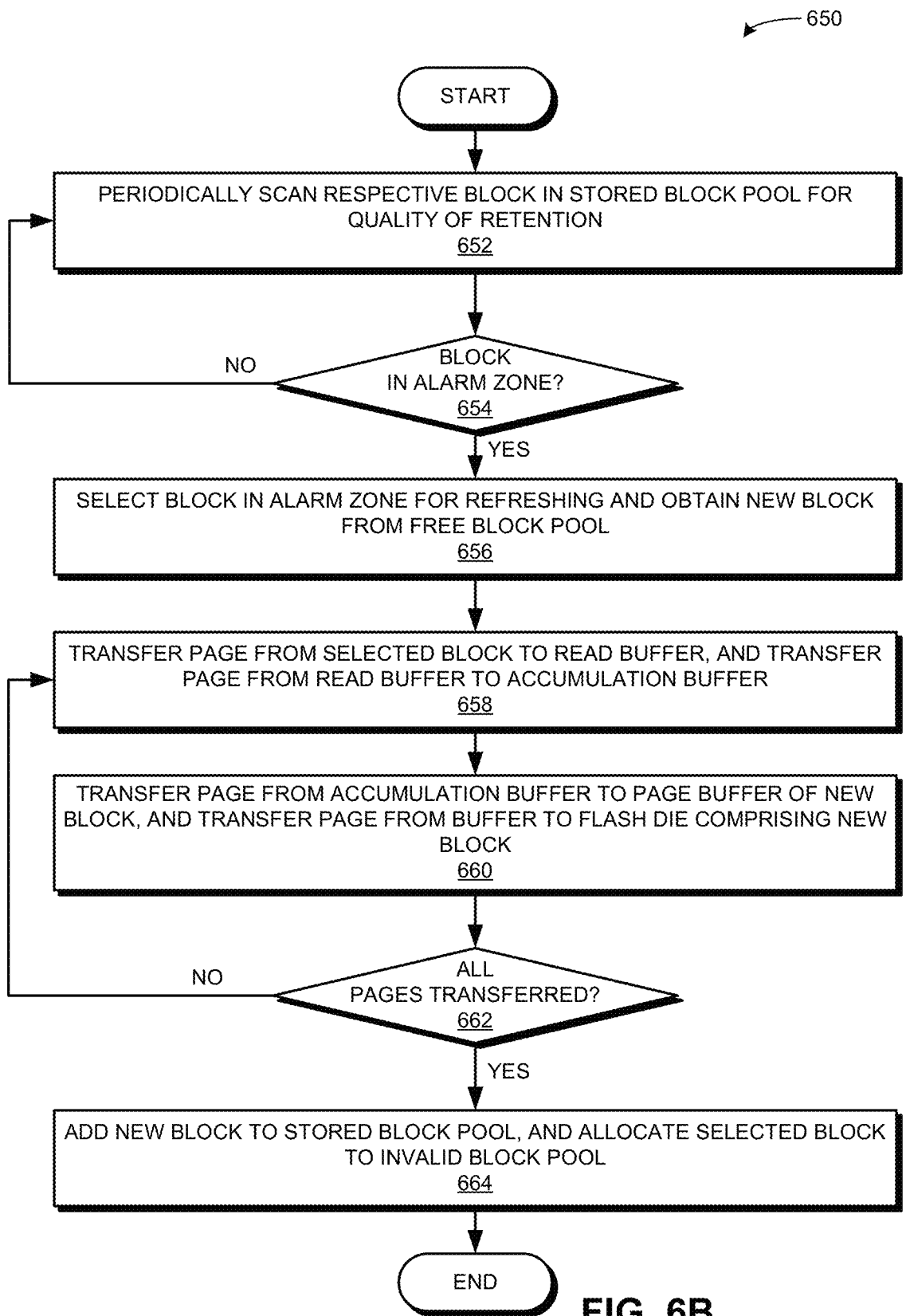
FIG. 6B presents a flowchart illustrating a method of a storage controller refreshing a block in an enhanced storage device, in accordance with an embodiment of the present application.

FIG. 6B presents a flowchart illustrating a method 650 of a storage controller refreshing a block in an enhanced storage device, in accordance with an embodiment of the present application. The controller periodically scans a respective block in the stored block pool for the quality of retention (operation 652) and checks whether any block is in the alarm zone (operation 654). If a block is not in the alarm zone, the controller continues to scan a respective block in the stored block pool for the quality of retention (operation 652). On the other hand, if a block is in the alarm zone, the controller selects the block in the alarm zone for refreshing and obtains a new block from the free block pool (operation 656).

The controller transfers a page from the selected block to a read buffer, and transfers the page from the read buffer to the accumulation buffer (operation 658). The controller then transfers the page from the accumulation buffer to the page buffer of the new block, and transfers the page from the page buffer to the flash die that includes the new block (operation 660). The controller then checks whether all pages in the selected block have been transferred (operation 662). If all pages have not been transferred, the controller continues to transfer a page from the selected block to a read buffer, and transfers the page from the read buffer to the accumulation buffer (operation 658). Otherwise, the controller adds the new block to the stored block pool, and allocates the selected block to the invalid block pool (operation 664).

Exemplary Computer System and Apparatus

Figure 7:
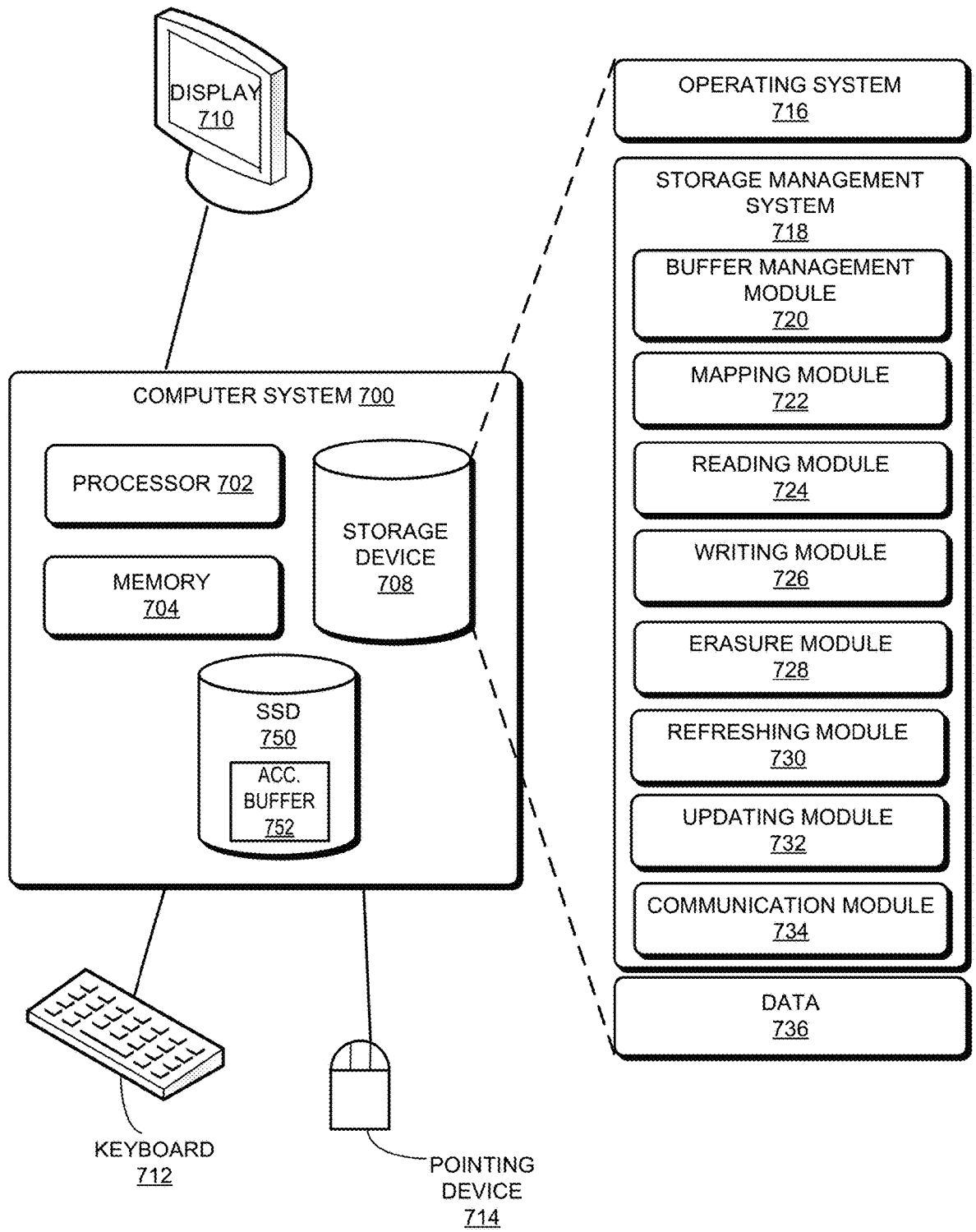
FIG. 7 illustrates an exemplary computer system that facilitates a storage management system for managing data in an enhanced storage device, in accordance with an embodiment of the present application.

FIG. 7 illustrates an exemplary computer system that facilitates a storage management system for managing data in an enhanced storage device, in accordance with an embodiment of the present application. Computer system 700 includes a processor 702, a memory 704, and a storage device 708. Computer system 700 can also include a storage device 750 (e.g., an SSD), and an accumulation buffer 752. Memory 704 can include a volatile memory (e.g., DIMM) that serves as a managed memory, and can be used to store one or more memory pools. Furthermore, computer system 700 can be coupled to a display device 710, a keyboard 712, and a pointing device 714. Storage device 708 can store an operating system 716, a storage management system 718, and data 736.

Storage management system 718 can include instructions, which when executed by computer system 700, can cause computer system 700 to perform methods and/or processes described in this disclosure. Specifically, storage management system 718 can include instructions for processing read and/or write requests for storage device 752 (buffer management module 720). Storage management system 718 can also include instructions for accumulating data in accumulation buffer 752 to facilitate write operations at the unit of a block (buffer management module 720). Furthermore, storage management system 718 can include instructions for generating the two-level mappings (mapping module 722).

Furthermore, storage management system 718 includes instructions for reading a page or a subpage from accumulation buffer 752 or storage device 750 at the unit of a page or subpage based on the multi-level mapping (reading module 724). Storage management system 718 can also include instructions for writing into the flash dies of storage device 750 from accumulation buffer 752 (writing module 726). Storage management system 718 can further include instructions for erasing the data at the unit of a block (erasure module 728).

Storage management system 718 can also include instructions for refreshing a block to ensure safe data retention (refreshing module 730). Storage management system 718 can include instructions for updating a block in response to receiving an update request for one or more pages in the block (updating module 732). Storage management system 718 can also include instructions for sending and receiving packets for read/write operations (communication module 734).

Data 736 can include any data that is required as input or that is generated as output by the methods and/or processes described in this disclosure. Specifically, data 736 can store at least: the two-level mapping, the read buffer, and the page buffer for a respective flash die.

Figure 8:
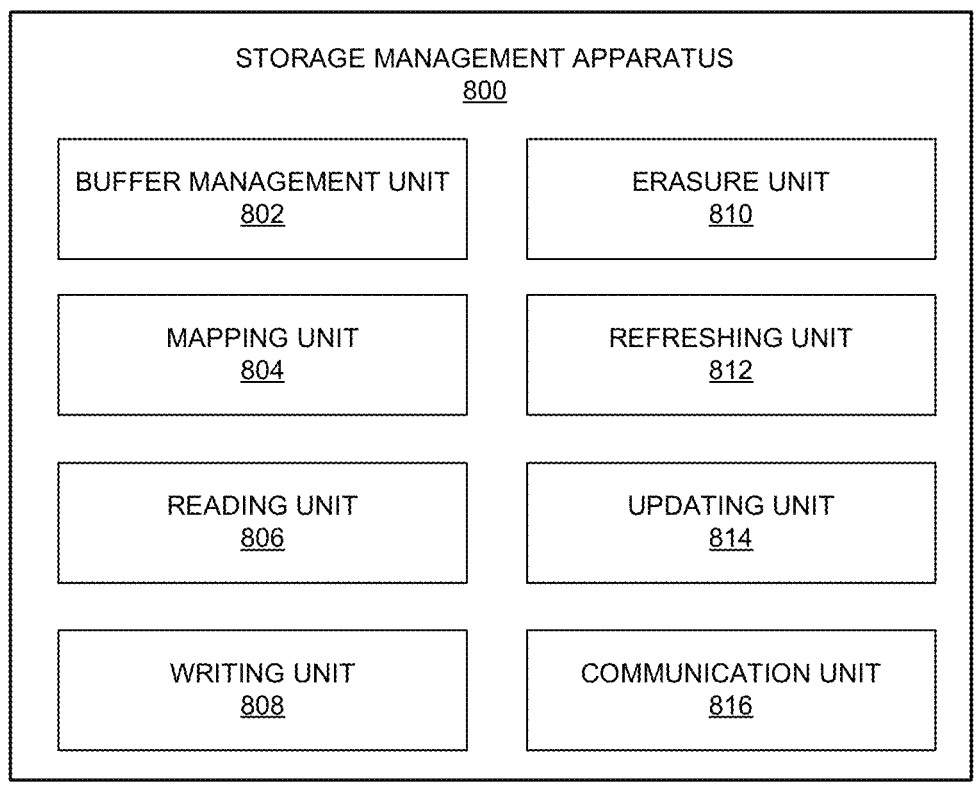
FIG. 8 illustrates an exemplary apparatus that facilitates a storage management system for managing data in an enhanced storage device, in accordance with an embodiment of the present application.

FIG. 8 illustrates an exemplary apparatus that facilitates a storage management system for managing data in an enhanced storage device, in accordance with an embodiment of the present application. Apparatus 800 can comprise a plurality of units or apparatuses which may communicate with one another via a wired, wireless, quantum light, or electrical communication channel. Apparatus 800 may be realized using one or more integrated circuits, and may include fewer or more units or apparatuses than those shown in FIG. 8. Further, apparatus 800 may be integrated in a computer system, or realized as a separate device which is capable of communicating with other computer systems and/or devices. Specifically, apparatus 800 can comprise units 802-816, which perform functions or operations similar to modules 720-734 of computer system 700 of FIG. 7, including: a buffer management unit 802; a mapping unit 804; a reading unit 806; a writing unit 808; an erasure unit 810; a refreshing unit 812, an updating unit 814, and a communication unit 816.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disks, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, fieldprogrammable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method for facilitating performance enhancement of a storage device, the method comprising:
   obtaining a write request for storing a data page in the storage device;
   determining a zone for the data page in an accumulation buffer integrated within the storage device, wherein the accumulation buffer is based on non-volatile memory and includes a plurality of zones, and wherein a respective zone is associated with a channel coupling a flash die of the storage device;
   storing the data page in the determined zone and determining whether the determined zone of the accumulation buffer has accumulated at least one block of data, wherein the block of data indicates a unit of an erasure operation on the storage device; and
   in response to the determined zone of the accumulation buffer accumulating the one block of data, transferring the block of data to a first block of a first flash die in the storage device from the determined zone of the accumulation buffer.

2. The method of claim 1, wherein transferring the block of data comprises:
   identifying the first block of the first flash die in a free block pool in the storage device;
   transferring a respective data page in the block of data to a page buffer of the first flash die; and
   programming the first flash die to store the data page in the first block.

3. The method of claim 2, wherein the accumulation buffer is based on a resistive random-access memory (ReRAM), and wherein the one or more flash dies are based on a Not AND (NAND) dies.

4. The method of claim 1, wherein a respective zone of the plurality of zones is configured to accumulate a block of data.

5. The method of claim 1, further comprising:
   obtaining a read request for retrieving the data page;
   determining whether the data page is in the accumulation buffer; and
   in response to determining that the data page is in the accumulation buffer, transferring the data page from the determined zone of the accumulation buffer to a read buffer integrated within the storage device.

6. The method of claim 5, further comprising, in response to determining that the data page is not in the accumulation buffer, transferring the data page from the first block of the first flash die to the read buffer integrated within the storage device.

7. The method of claim 1, further comprising:
   representing the first block as a logical file;
   maintaining a first mapping that maps a filename of the logical file and a corresponding logical index to a first physical index identifying the block of data in the storage device; and
   maintaining a second mapping that maps an offset from the logical index to a second physical index identifying a subpage in the block of data in the storage device.

8. The method of claim 1, further comprising:
   determining whether data in a second block in the storage device can be safely retained; and
   in response to determining that data in the second block cannot be safely retained, refreshing the second block by transferring the data in the second block to a third block via the accumulation buffer.

9. The method of claim 1, further comprising:
   determining whether data in a second block in a second flash die of the storage device has been updated; and
   in response to determining that data in the second block has been updated, storing the updated data by:
      transferring the data in the second block to a second zone of the accumulation buffer;
      updating the transferred data in the second zone of the accumulation buffer; and
      transferring the updated data from the second zone of the accumulation buffer to a third block of the second flash die in a free block pool of the storage device.

10. The method of claim 1, further comprising:
    enabling a lock on the first flash die for blocking read/write operation on the first flash die, wherein the first flash die includes a second block comprising expired data;
    performing an erasure operation that removes the expired data from the second block;
    releasing the lock on the first flash die; and
    adding the second block to a free block pool of the storage device.

11. A storage device, comprising:
    a controller configured to manage storage in the storage device;
    one or more flash dies configured to store data;
    an accumulation buffer based on non-volatile memory, wherein the accumulation buffer includes a plurality of zones, and wherein a respective zone is associated with a channel coupling a flash die of the one or more flash dies;
    a buffer management module configured to:
       obtain a write request for storing a data page in the storage device;
       determining a zone for the data page in the accumulation buffer; and
       storing the data page in the determined zone and determine whether the determined zone of the accumulation buffer has accumulated at least one block of data, wherein the block of data indicates a unit of an erasure operation on the storage device; and
    a writing module configured to, in response to the determined zone of the accumulation buffer accumulating the one block of data, transfer the block of data to a first block of a first flash die in the storage device from the determined zone of the accumulation buffer.

12. The storage device of claim 11, wherein the writing module is configured to transfer the block of data by:
    identifying the first block of the first flash die in a free block pool in the storage device;

transferring a respective data page in the block of data to a page buffer of the first flash die; and programming the first flash die to store the data page in the first block.

13. The storage device of claim 11, wherein the accumulation buffer is based on a resistive random-access memory (ReRAM), and wherein the one or more flash dies are based on Not AND (NAND) dies.

14. The storage device of claim 11, wherein a respective zone of the plurality of zones is configured to accumulate a block of data.

15. The storage device of claim 11, wherein the buffer management module is further configured to obtain a read request for retrieving the data page;

wherein the storage device further comprises a reading module configured to:

determine whether the data page is in the accumulation buffer; and in response to determining that the data page is in the accumulation buffer, transfer the data page from the determined zone of the accumulation buffer to a read buffer integrated within the storage device.

16. The storage device of claim 15, wherein the reading module is further configured to, in response to determining that the data page is not in the accumulation buffer, transfer the data page from the first block of the first flash die to the read buffer integrated within the storage device.

17. The storage device of claim 11, further comprising a mapping module configured to:

represent the first block as a logical file;

maintain a first mapping that maps a filename of the logical file and a corresponding logical index to a first physical index identifying the block of data in the storage device; and maintain a second mapping that maps an offset from the logical index to a second physical index identifying a subpage in the block of data in the storage device.

18. The storage device of claim 11, further comprising a refreshing module configured to:

determine whether data in a second block in the storage device can be safely retained; and in response to determining that data in the second block cannot be safely retained, refresh the second block by transferring the data in the second block to a third block via the accumulation buffer.

19. The storage device of claim 11, further comprising an updating module configured to:

determine whether data in a second block in a second flash die of the storage device has been updated; and in response to determining that data in the second block has been updated, store the updated data by:

transferring the data in the second block to a second zone of the accumulation buffer;

updating the transferred data in the second zone of the accumulation buffer; and transferring the updated data from the second zone of the accumulation buffer to a third block of the second flash die in a free block pool of the storage device.

20. The storage device of claim 11, further comprising an erasure module configured to:

enable a lock on the first flash die for blocking read/write operation on the first flash die, wherein the first flash die includes a second block comprising expired data;

perform an erasure operation that removes the expired data from the second block;

release the lock on the first flash die; and add the second block to a free block pool of the storage device.

* * * * *